United States Patent
Takaku et al.

(10) Patent No.: US 10,727,378 B2
(45) Date of Patent: Jul. 28, 2020

(54) OPTICAL WAVELENGTH CONVERSION MEMBER AND LIGHT-EMITTING DEVICE

(71) Applicant: NGK SPARK PLUG CO., LTD., Nagoya-shi, Aichi (JP)

(72) Inventors: Shohei Takaku, Komaki (JP); Yusuke Katsu, Komaki (JP); Tsuneyuki Ito, Aichi (JP); Yuki Shimura, Nagoya (JP); Takeshi Mitsuoka, Konan (JP); Jun Moteki, Seto (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 16/342,390

(22) PCT Filed: Oct. 20, 2017

(86) PCT No.: PCT/JP2017/037920
§ 371 (c)(1),
(2) Date: Apr. 16, 2019

(87) PCT Pub. No.: WO2018/079421
PCT Pub. Date: May 3, 2018

(65) Prior Publication Data
US 2019/0259918 A1  Aug. 22, 2019

(30) Foreign Application Priority Data

Oct. 28, 2016 (JP) .................................. 2016-211843
Nov. 2, 2016 (JP) .................................. 2016-215303
(Continued)

(51) Int. Cl.
*H01L 33/50* (2010.01)
*C04B 35/50* (2006.01)
*G02B 5/20* (2006.01)

(52) U.S. Cl.
CPC ............ *H01L 33/502* (2013.01); *C04B 35/50* (2013.01); *G02B 5/20* (2013.01); *H01L 33/50* (2013.01); *H01L 2933/0041* (2013.01)

(58) Field of Classification Search
CPC ................... H01L 33/502; H01L 33/50; H01L 2933/0041; G02B 5/20; C04B 35/50; C09K 11/77; C09K 11/7774
See application file for complete search history.

(56) References Cited

U.S. PATENT DOCUMENTS 7,022,636 B2    4/2006 Hamada et al.
8,088,304 B2 *  1/2012 Winkler ............. C09K 11/7774
                                                252/301.4 R
(Continued)

FOREIGN PATENT DOCUMENTS

EP    2 070 891 A1    6/2009
JP    5088977 B2      12/2012
(Continued)

OTHER PUBLICATIONS

Park et al. ("A Yellow-Emitting Oxynitride Phosphor: Ce4-xCaxSi12O3+xN18-x:Eu2+," ECS Journal of Solid State Science and Technology, 2 (2) R3100-R3106, 2013) (Year: 2013).*
(Continued)

*Primary Examiner* — Yasser A Abdelaziez
(74) *Attorney, Agent, or Firm* — Sughrue Mion, PLLC

(57) ABSTRACT

An optical wavelength conversion member and a light-emitting device including the optical wavelength conversion member. The optical wavelength conversion member (9) is formed of a ceramic sintered body having a fluorescent phase containing fluorescent crystal grains as a main component and a translucent phase containing translucent crystal grains as a main component. Crystal grains of the fluorescent phase have a composition represented by formula $A_3B_5O_{12}$:Ce, where the element A is selected from Sc, Y, and
(Continued)

lanthanoids (except for Ce), and the element B is selected from Al and Ga. In the optical wavelength conversion member (9), $0.3<a<34$ and $300~\mu m<y<1{,}050~\mu m$ are satisfied, wherein a represents the area ratio of the translucent phase to the fluorescent phase in a cross section of the optical wavelength conversion member (9), and y represents the interfacial length of the fluorescent phase.

6 Claims, 3 Drawing Sheets

(30) Foreign Application Priority Data

Jan. 31, 2017 (JP) ................................. 2017-015653
May 19, 2017 (JP) ................................. 2017-100204
Jul. 31, 2017 (JP) ................................. 2017-148393

(56) References Cited

U.S. PATENT DOCUMENTS

| | | | |
|---|---|---|---|
| 2008/0187746 A1 | 8/2008 | De Graaf et al. | |
| 2011/0181173 A1 | 7/2011 | De Graaf et al. | |
| 2012/0045634 A1 | 2/2012 | Irie et al. | |
| 2013/0256599 A1 | 10/2013 | Irie | |
| 2015/0048401 A1 | 2/2015 | Iba et al. | |
| 2015/0219291 A1 | 8/2015 | Yamaguchi | |
| 2015/0247618 A1 | 9/2015 | Irie | |
| 2017/0088774 A1 | 3/2017 | Asai et al. | |

FOREIGN PATENT DOCUMENTS

| | | |
|---|---|---|
| JP | 5490407 B2 | 5/2014 |
| JP | 2014-132084 A | 7/2014 |
| JP | 5650885 B2 | 1/2015 |
| JP | 2015-034120 A | 2/2015 |
| JP | 2015-149394 A | 8/2015 |
| JP | 2016-172837 A | 9/2016 |
| TW | 201402782 A | 1/2014 |
| TW | 201606050 A | 2/2016 |

OTHER PUBLICATIONS

International Search Report (PCT/ISA/210) dated Jan. 23, 2018 issued by the International Searching Authority in International Application No. PCT/JP2017/037920.
Communication dated Apr. 14, 2020 issued by the European Intellectual Property Office in counterpart European Application No. 17865959.5.

\* cited by examiner

OPTICAL WAVELENGTH CONVERSION MEMBER AND LIGHT-EMITTING DEVICE

CROSS REFERENCE TO RELATED APPLICATIONS

This application is a National Stage of International Application No. PCT/JP2017/037920, filed Oct. 20, 2017, claiming priority based on Japanese Patent Application Nos. 2016-211843 filed Oct. 28, 2016, 2016-215303 filed Nov. 2, 2016, 2017-015653 filed Jan. 31, 2017, 2017-100204 filed May 19, 2017 and 2017-148393 filed Jul. 31, 2017.

TECHNICAL FIELD

The present disclosure relates to an optical wavelength conversion member capable of converting light wavelength and used for, for example, a wavelength converter, a fluorescent material, a lighting apparatus, or a video apparatus, and to a light-emitting device.

BACKGROUND ART

Recently, in head lamps and other lighting apparatuses, white light is generally achieved through wavelength conversion, by use of a phosphor, of blue light emitted from a light-emitting diode (LED) or a laser diode (LD).

Such a phosphor is known to be used with a resin matrix, a glass matrix, or other matrices. However, in recent years, as the output of a light source increases, the phosphor is required to have higher durability. Thus, ceramic-based phosphors have received attention (see Patent Documents 1 to 3).

A typically known ceramic phosphor is a Ce-activated garnet ($A_3B_5O_{12}$) component, such as $Y_3Al_5O_{12}$:Ce (YAG:Ce).

PRIOR ART DOCUMENT

Patent Document

Patent Document 1: Japanese Patent Application Laid-Open (kokai) No. 2014-132084
Patent Document 2: Japanese Patent Application Laid-Open (kokai) No. 2015-34120
Patent Document 3: Japanese Patent Application Laid-Open (kokai) No. 2015-149394

SUMMARY OF THE INVENTION

Problem to be Solved by the Invention

The aforementioned conventional techniques have problems described below, and the problems are required to be solved.

Specifically, the technique disclosed in Patent Document 1 involves dispersion of $CeAl_{11}O_{18}$ in the phosphor matrix for preventing color unevenness due to Ce volatilization during a firing process. However, $CeAl_{11}O_{18}$ (i.e., a third component) absorbs light and thus causes reduction in emission intensity and illuminance. Although such a problem needs to be solved through, for example, considerably reducing the thickness of the fluorescent body, such a reduced thickness may cause another problem; i.e., impairment of the durability of the structure of the fluorescent body.

In the technique disclosed in Patent Document 2, a ceramic member contains a rare earth element capable of forming an emission center ion in an amount of 1 to 50 mol %. However, an increase in emission center ion content may cause concentration quenching, resulting in low emission intensity or light flux. Thus, incorporation of a rare earth element in an amount within the aforementioned range causes very poor fluorescent properties and illuminance.

The technique disclosed in Patent Document 3 involves employment of a structure in which a grain of YAG (which may serve as an emission component) is surrounded by grains of YAG not activated with Ce, for preventing reflection of excitation light at the interface between YAG and $Al_2O_3$ grains. However, this structure may cause temperature quenching, since the heat generated by YAG (i.e., a fluorescent component) is difficult to dissipate.

Thus, the aforementioned techniques encounter difficulty in achieving an optical wavelength conversion member exhibiting high illuminance, high fluorescence intensity, and reduced color unevenness.

In view of the foregoing, an object of the present disclosure is to provide an optical wavelength conversion member and a light-emitting device, each of which exhibits high illuminance, high fluorescence intensity, and reduced color unevenness.

Means for Solving the Problem (1) A first aspect of the present disclosure is directed to an optical wavelength conversion member comprising a ceramic sintered body having a fluorescent phase containing fluorescent crystal grains as a main component and a translucent phase containing translucent crystal grains as a main component.

In the optical wavelength conversion member, the crystal grains of the fluorescent phase have a composition represented by formula $A_3B_5O_{12}$:Ce, and each of the element A and the element B is at least one element selected from the following element groups:

A: Sc, Y, and lanthanoids (except for Ce), and
B: Al and Ga. In the optical wavelength conversion member, the following relations are satisfied:

$0.3 < a < 34$ and $300\ \mu m < y < 1{,}050\ \mu m$, wherein a represents the ratio of the area of the translucent phase to the area of the fluorescent phase in a cross section of the optical wavelength conversion member, and y represents the interfacial length of the fluorescent phase.

In the first aspect, the ceramic sintered body basically has a garnet structure represented by $A_3B_5O_{12}$:Ce containing at least one element selected from the aforementioned element groups.

This structural property can achieve effective conversion of blue light into visible light.

Particularly in the first aspect, the area ratio a of the translucent phase to the fluorescent phase in a cross section of the optical wavelength conversion member satisfies the following relation $0.3 < a < 34$, and the interfacial length y of the fluorescent phase satisfies the following relation $300\ \mu m < y < 1{,}050\ \mu m$. Thus, when the optical wavelength conversion member is irradiated with light, high illuminance and high fluorescence intensity are achieved, and color unevenness is reduced as shown in the Examples and other sections described hereinbelow.

When the interfacial length y of the fluorescent phase is less than $300\ \mu m$; i.e., when the size of an aggregation of the fluorescent phase is large in a predetermined region (specifically, per specified unit area), or the amount of the fluorescent phase is small, optical diffusion is reduced at the interface between the fluorescent phase and the translucent phase, resulting in increased transmittance, illuminance, and fluorescence intensity. However, color unevenness occurs.

Meanwhile, when the interfacial length y of the fluorescent phase exceeds 1,050 μm; i.e., when the size of an aggregation of the fluorescent phase is small in a predetermined region, optical diffusion increases at the interface between the fluorescent phase and the translucent phase, resulting in low transmittance and reduced color unevenness. However, illuminance and fluorescence intensity decrease.

When the area ratio a is less than 0.3, the translucent phase is insufficient, and thus translucency is unsatisfactory, and illuminance and fluorescence intensity decrease. Meanwhile, when the area ratio a exceeds 34, the amount of the fluorescent component is insufficient, and thus satisfactory emission is not achieved.

Notably, the optical wavelength conversion member according to the first aspect exhibits excellent heat resistance and durability.

(2) In a second aspect of the present disclosure, which is a specific embodiment of the first aspect, wherein the following relation is satisfied: $1.1<x<2.1$, wherein x represents the ratio of the mean grain size r1 of crystal grains of the translucent phase to the mean grain size r2 of crystal grains of the fluorescent phase; the crystal grains of the translucent phase have a mean grain size r1 of 0.2 μm to 6 μm; and the crystal grains of the fluorescent phase have a mean grain size r2 of 0.1 μm to 4 μm.

When the aforementioned ratio x (i.e., the grain size ratio x) is less than 1.1, transmittance decreases, and blue light diffusion increases. Thus, color unevenness is reduced, but illuminance and fluorescence intensity decrease.

Meanwhile, when the grain size ratio x exceeds 2.1, transmittance increases, and illuminance and fluorescence intensity increase, but color unevenness occurs.

Therefore, the grain size ratio x preferably falls within the aforementioned range.

When the crystal grains of the translucent phase have a mean grain size r1 of 0.2 μm to 6 μm, and the crystal grains of the fluorescent phase have a mean grain size r2 of 0.1 μm to 4 μm, the resultant ceramic phosphor exhibits high fluorescence intensity and illuminance and reduced color unevenness.

When the crystal grains of the translucent phase have a mean grain size r1 of less than 0.2 μm, and the crystal grains of the fluorescent phase have a mean grain size r2 of less than 0.1 μm, blue light and yellow light diffusion increases, and thus color unevenness is reduced. However, the transmittances of blue light and yellow light are lowered, and fluorescence intensity and illuminance are also lowered.

Meanwhile, when the crystal grains of the translucent phase have a mean grain size r1 of more than 6 μm, and the crystal grains of the fluorescent phase have a mean grain size r2 of more than 4 μm, transmittance increases, and fluorescence intensity and illuminance increase, but color unevenness increases.

(3) In a third aspect of the present disclosure, which is a specific embodiment of the first or second aspect, wherein the crystal grains of the translucent phase have a composition of $Al_2O_3$.

This is an example of preferred composition of the crystal grains of the translucent phase.

(4) In a fourth aspect of the present disclosure, which is a specific embodiment of any one of the first to third aspects, wherein the ceramic sintered body contains a compound represented by formula $A_3B_5O_{12}$:Ce in an amount of 3 vol. % to 70 vol. %.

When the $A_3B_5O_{12}$:Ce content of the entire ceramic sintered body is 3 vol. % to 70 vol. %, the ceramic sintered body exhibits high illuminance and reduced color unevenness.

When the $A_3B_5O_{12}$:Ce content is less than 3 vol. %, the amount of the fluorescent component is insufficient, resulting in unsatisfactory emission, whereas when the $A_3B_5O_{12}$:Ce content exceeds 70 vol. %, the amount of the translucent phase is insufficient, resulting in unsatisfactory translucency and low illuminance and fluorescence intensity.

(5) In a fifth aspect of the present disclosure, which is a specific embodiment of any one of the first to fourth aspects, wherein the Ce content of the compound represented by formula $A_3B_5O_{12}$:Ce is 0.1 mol % to 1.0 mol % relative to the element A of the compound.

When the Ce content of the compound represented by $A_3B_5O_{12}$:Ce is 0.1 mol % to 1.0 mol % relative to the element A in the ceramic sintered body, the ceramic sintered body exhibits high illuminance and fluorescence intensity and reduced color unevenness.

When the Ce content is less than 0.1 mol %, the amount of the emission center ion is small, and the amount of the fluorescent component is insufficient, resulting in unsatisfactory emission, whereas when the Ce content exceeds 1.0 mol %, the amount of the emission center ion increases, and concentration quenching occurs, resulting in low fluorescence intensity and illuminance.

(6) A sixth aspect of the present disclosure is directed to a light-emitting device comprising an optical wavelength conversion member as recited in any one of the first to fifth aspects.

The light (i.e., fluorescence) having a wavelength converted with the light-emitting device (specifically, the optical wavelength conversion member) according to the sixth aspect exhibits high fluorescence intensity and high color uniformity.

The light-emitting device may include any known light-emitting element, such as LED or LD.

<Characteristic Features of the Present Invention Will Now be Described>

The term "fluorescent phase" refers to a phase containing fluorescent crystal grains as a main component, and the term "translucent phase" refers to a phase containing translucent crystal grains (specifically, crystal grains having a composition different from that of the crystal grains of the fluorescent phase) as a main component.

The term "main component" refers to a component which is present in the optical wavelength conversion member in the largest amount (i.e., volume). For example, the fluorescent phase may contain fluorescent crystal grains in an amount of 50 vol. % or more (preferably 90 vol. % or more). For example, the translucent phase may contain translucent crystal grains in an amount of 50 vol. % or more (preferably 90 vol. % or more).

The term "optical wavelength conversion member," which has the aforementioned characteristic features, is formed of a ceramic sintered body. Crystal grains or the grain boundary therebetween may contain an unavoidable impurity. The ceramic sintered body may contain the fluorescent phase and the translucent phase (i.e., fluorescent crystal grains and translucent crystal grains) in an amount of 50 vol. % or more (preferably 90 vol. % or more).

The term "$A_3B_5O_{12}$:Ce" refers to the case where a portion of the element A contained in $A_3B_5O_{12}$ is substituted by Ce through formation of a solid solution. The compound having such a structure exhibits fluorescent properties.

The term "interfacial length" refers to the total perimeter length of a portion forming one or more fluorescent phases in a predetermined region (specifically, a unit area of 500 µm$^2$) in a cross section of the optical wavelength conversion member. For example, in the case where a plurality of independent fluorescent phases are present in a predetermined region, the interfacial length is the total of the perimeter lengths of the fluorescent phases.

MODES FOR CARRYING OUT THE INVENTION

Next will be described an optical wavelength conversion member and a light-emitting device according to an embodiment of the present disclosure.

1. Embodiment

[1-1. Light-Emitting Device]

Now will be described an optical wavelength conversion member and a light-emitting device according to the present embodiment.

Figure 1:
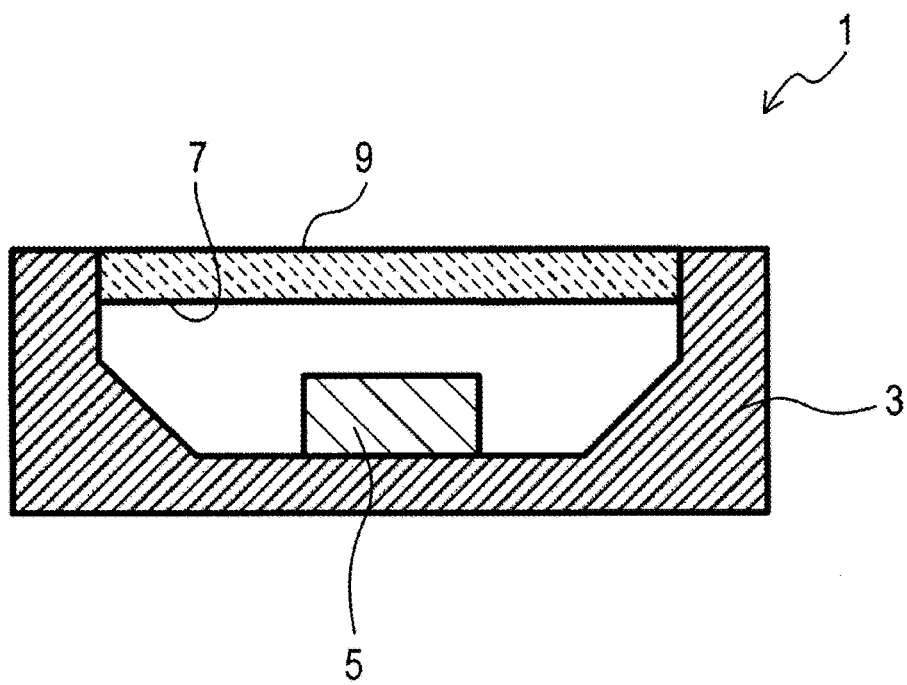
FIG. 1 Cross-sectional view of a light-emitting device in a thickness direction, the light-emitting device including an optical wavelength conversion member according to an embodiment.

As illustrated in FIG. 1, a light-emitting device 1 of the present embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

In the light-emitting device 1, light emitted from the light-emitting element 5 transmits through the translucent optical wavelength conversion member 9, and the wavelength of a portion of the emitted light is converted in the interior of the optical wavelength conversion member 9. Thus, the optical wavelength conversion member 9 emits fluorescence having a wavelength different from that of light emitted from the light-emitting element 5.

For example, the optical wavelength conversion member 9 converts the wavelength of blue light emitted from an LD, whereby the optical wavelength conversion member 9 as a whole emits white light to the outside (e.g., upward in FIG. 1).

[1-2. Optical Wavelength Conversion Member]

The optical wavelength conversion member 9 will now be described.

The optical wavelength conversion member 9 of the present embodiment is formed of a ceramic sintered body having a fluorescent phase containing fluorescent crystal grains (i.e., fluorescent phase grains) as a main component and a translucent phase containing translucent crystal grains (i.e., translucent phase grains) as a main component.

In the optical wavelength conversion member 9, the fluorescent phase grains have a composition represented by formula $A_3B_5O_{12}$:Ce, and each of the element A and the element B is at least one element selected from the following element groups:

A: Sc, Y, and lanthanoids (except for Ce), and
B: Al and Ga.

A and B of the aforementioned chemical formula $A_3B_5O_{12}$:Ce correspond to elements (different elements) forming a substance represented by formula $A_3B_5O_{12}$:Ce wherein O is oxygen and Ce is cerium.

In the optical wavelength conversion member 9, the following relations are satisfied: $0.3<a<34$ and $300\ \mu m<y<1{,}050\ \mu m$ wherein a represents the ratio of the area of the translucent phase to the area of the fluorescent phase in a cross section of the optical wavelength conversion member 9, and y represents the interfacial length of the fluorescent phase in a predetermined region.

The predetermined region corresponds to a unit area of 500 µm$^2$, and the interfacial length y is the total of interfacial lengths corresponding to the perimeter lengths of fluorescent phases in the unit area.

In addition, the following relation is satisfied: $1.1<x<2.1$, wherein x represents the ratio of the mean grain size r1 of the translucent phase grains to the mean grain size r2 of the fluorescent phase grains; the translucent phase grains have a mean grain size r1 of 0.2 µm to 6 µm; and the fluorescent phase grains have a mean grain size r2 of 0.1 µm to 4 µm.

In the optical wavelength conversion member 9, the ceramic sintered body contains a compound represented by formula $A_3B_5O_{12}$:Ce in an amount of 3 vol. % to 70 vol. %.

The Ce content of the compound represented by formula $A_3B_5O_{12}$:Ce is 0.1 mol % to 1.0 mol % relative to the element A of the compound.

The translucent phase grains have, for example, a composition of $Al_2O_3$.

[1-2. Production Method for Optical Wavelength Conversion Member]

Figure 2:
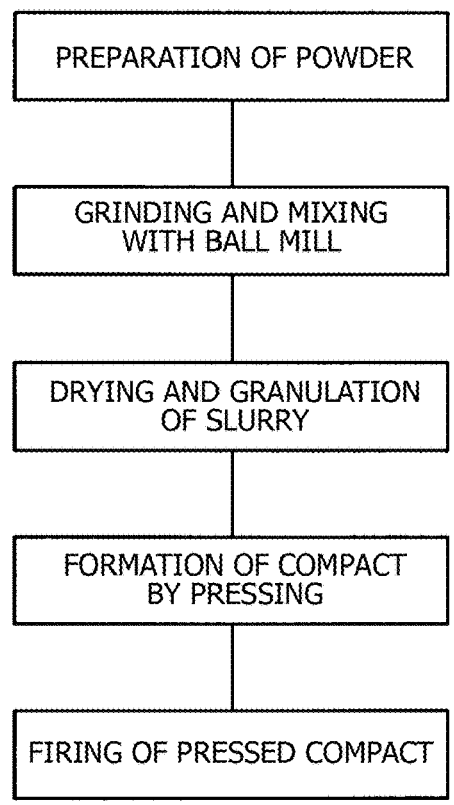
FIG. 2 Explanatory view showing a production process for the optical wavelength conversion member according to the embodiment.

A schematic production process for the optical wavelength conversion member 9 will now be briefly described with reference to FIG. 2.

Firstly, powder materials for the optical wavelength conversion member 9 (i.e., ceramic sintered body) were weighed so as to satisfy the aforementioned embodiment (i.e., the powder materials were prepared).

Subsequently, an organic solvent and a dispersant were added to the prepared powder materials, and these materials were ground and mixed in a ball mill, to thereby prepare a slurry.

Subsequently, the slurry was dried and granulated.

The resultant granular product was then press-formed into a compact.

The compact was then fired at a specific temperature for a specific period of time, to thereby prepare a ceramic sintered body.

The ceramic sintered body may be produced by any process instead of the aforementioned press-forming process. For example, the ceramic sintered body may be produced by a process involving formation of a sheet from the slurry, and firing of the sheet.

[1-3. Effects]

The effects of the present embodiment will now be described.

(1) In the present embodiment, the ceramic sintered body basically has a garnet structure represented by $A_3B_5O_{12}$:Ce containing at least one element selected from the aforementioned element groups. This property can achieve effective conversion of blue light into visible light.

Particularly in the present embodiment, the area ratio a of the translucent phase to the fluorescent phase in a cross section of the optical wavelength conversion member 9 satisfies the following relation $0.3<a<34$, and the interfacial length y of the fluorescent phase satisfies the following relation $300\ \mu m<y<1{,}050\ \mu m$. Thus, when the optical wavelength conversion member 9 is irradiated with light emitted from the light-emitting element 5, high illuminance and high fluorescence intensity are achieved, and color unevenness is reduced.

(2) In the present embodiment, the grain size ratio x (i.e., the ratio of the mean grain size r1 of the translucent phase grains to the mean grain size r2 of the fluorescent phase grains) satisfies the relation $1.1<x<2.1$; the crystal grains of the translucent phase have a mean grain size r1 of 0.2 µm to 6 µm; and the crystal grains of the fluorescent phase have a mean grain size r2 of 0.1 µm to 4 µm.

This characteristic feature achieves further high illuminance and fluorescence intensity and reduced color unevenness.

(3) In the present embodiment, the ceramic sintered body contains a compound represented by formula $A_3B_5O_{12}$:Ce in an amount of 3 vol. % to 70 vol. %.

This characteristic feature achieves further high illuminance and fluorescence intensity and reduced color unevenness.

(4) In the present embodiment, the Ce content of the compound represented by formula $A_3B_5O_{12}$:Ce is 0.1 mol % to 1.0 mol % relative to the element A of the compound.

This characteristic feature achieves further high illuminance and fluorescence intensity and reduced color unevenness.

(5) The light (i.e., fluorescence) having a wavelength converted with the light-emitting device 1 (specifically, the optical wavelength conversion member 9) of the present embodiment exhibits high fluorescence intensity. The light exhibits reduced color unevenness; i.e., high color uniformity.

2. Examples

Specific examples of the aforementioned embodiment will next be described.

There were prepared ceramic sintered body samples (Nos. 1 to 30) shown below in Table 1; i.e., samples of optical wavelength conversion members of Examples 1 to 5.

Samples Nos. 3 to 7 and 11 to 30 fall within the scope of the present disclosure, and samples Nos. 1, 2, and 8 to 10 fall outside the scope of the present disclosure (Comparative Examples).

[2-1. Sample Evaluation Method]

Now will be described methods of evaluating the samples.

<Relative Density>

The density of each ceramic sintered body sample was measured by the Archimedes method, and the measured density was converted into a relative density.

<Open Porosity>

The open porosity of each ceramic sintered body sample was measured by the method specified by JIS R1634.

<Area Ratio>

Figure 3:
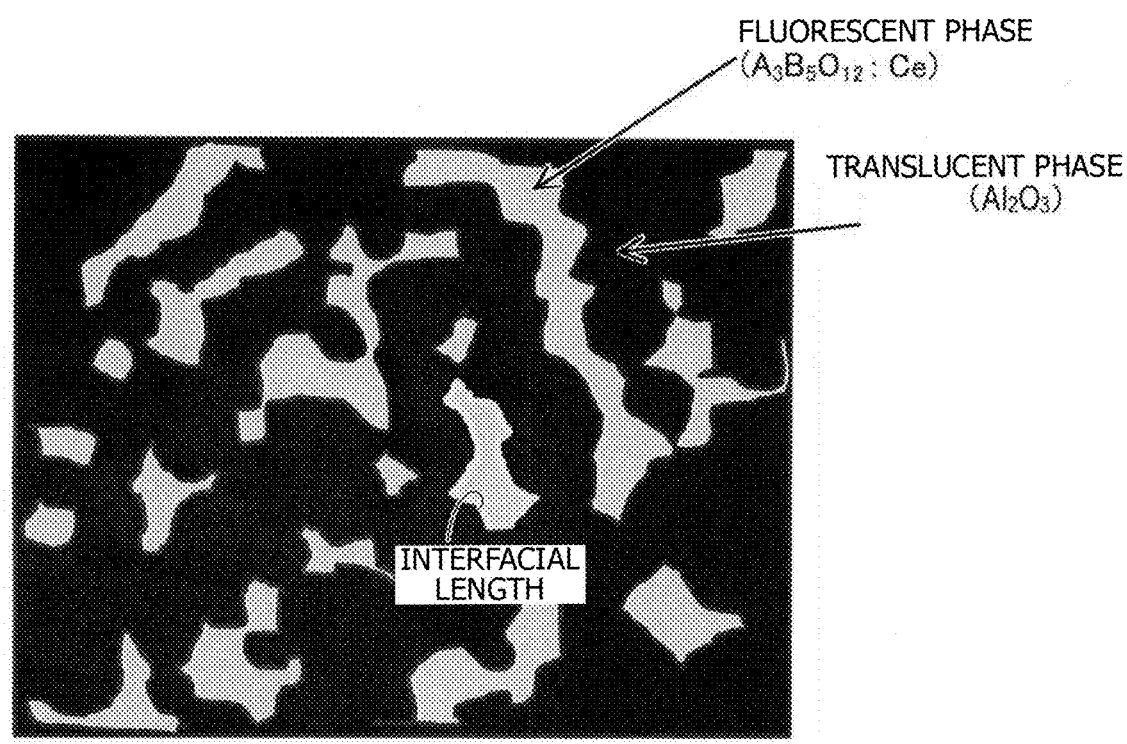
FIG. 3 Schematic view showing an SEM image of a cross section of the optical wavelength conversion member according to the embodiment; specifically, schematic view showing an SEM image of an unetched cross-sectional surface.

Each ceramic sintered body sample was sectioned, and the cross-sectional surface was subjected to mirror polishing. The polished surface was observed under a scanning electron microscope (SEM) at a magnification of 5,000, to thereby prepare an SEM image. FIG. 3 is a schematic view of an example of an SEM image. In FIG. 3, off-white bright portions correspond to fluorescent phases, and dark (black) portions correspond to translucent phases.

In a 500 µm² region of the SEM image, the area ST of translucent phases and the area SK of fluorescent phases were measured. The area ratio a of the area ST of translucent phases to the area SK of fluorescent phases (i.e., ST/SK) was determined through calculation.

The aforementioned area was determined through processing of the SEM image with image analysis software (e.g., Winloof). In an SEM image (×5,000), the area may be measured in a specific visual field region, and then the specific visual field region may be converted into a 500 µm² region for determination of the area ratio a. For determination of the below-described interfacial length, the specific visual field region may be converted into a 500 µm² region in the same manner as described above.

<Mean Crystal Grain Size>

Figure 4:
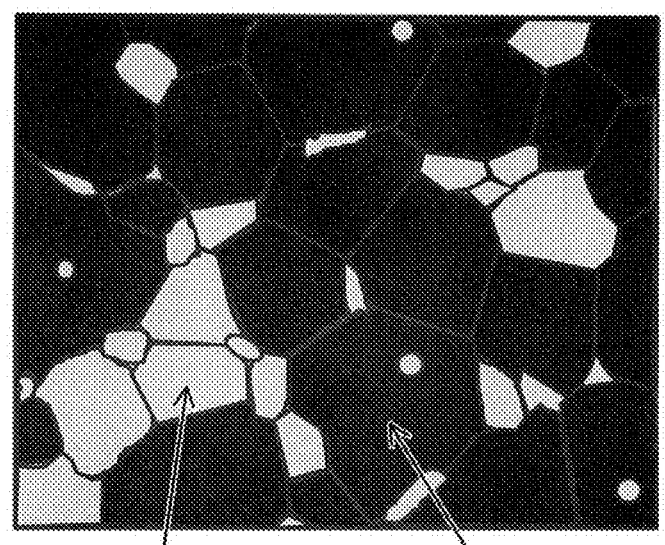
FIG. 4 Schematic view showing an SEM image of a cross section of the optical wavelength conversion member according to the embodiment; specifically, schematic view showing an SEM image of an etched cross-sectional surface.

Each ceramic sintered body sample was sectioned, and the cross-sectional surface was subjected to mirror polishing and subsequent thermal etching at 1,350° C. The etched surface was subjected to SEM observation, to thereby prepare ×2,500 images (i.e., SEM images) at five positions of the ceramic sintered body. FIG. 4 is a schematic view of an example of SEM image. In FIG. 4, bright portions correspond to fluorescent phase grains, and dark portions correspond to translucent phase grains.

Five lines were drawn in a 20 µm square region of the SEM image at each of the aforementioned positions, and the intercept method was used to determine the mean crystal grain sizes (i.e., mean grain sizes) of fluorescent phase grains and translucent phase grains. Thus, the mean grain size r2 of fluorescent phase grains and the mean grain size r1 of translucent phase grains were determined in all the five regions.

<Grain Size Ratio>

The grain size ratio x was calculated from the mean grain size r2 of fluorescent phase grains and the mean grain size r1 of translucent phase grains by use of the following formula (1).

$$\text{Grain size ratio } x = \text{(the mean grain size } r1 \text{ of translucent phase grains)/(the mean grain size } r2 \text{ of fluorescent phase grains)} \quad (1)$$

<Interfacial Length>

In the ×5,000 SEM image used for determination of the area ratio, the interfacial length of each fluorescent phase was determined by use of the aforementioned image analysis software (e.g., Winloof) in each of the five regions. Thus, the interfacial length per fluorescent phase unit was determined. In a region including a plurality of fluorescent phases, the interfacial lengths of the fluorescent phases were summed. Thus, the interfacial lengths of all the fluorescent phases were determined in each region, and the interfacial lengths were summed (i.e., the total interfacial length was determined) in each region.

Each of the five regions has an area of 500 μm². The total interfacial lengths were determined in the five regions and then averaged. The average value was defined as the interfacial length y.

FIG. 3 illustrates an example of the interfacial length; i.e., the interfacial length per fluorescent phase unit. In FIG. 3, the length of a white annular line surrounding one fluorescent phase (i.e., one off-white bright portion) corresponds to the interfacial length per fluorescent phase unit.

<Illuminance>

Illuminance was measured by means of an illuminometer. Specifically, each sample was processed into a shape of 13 mm×13 mm×0.2 mm (thickness). Blue LD light (wavelength: 465 nm) was focused to a width of 0.5 mm by means of a lens, and the processed sample was irradiated with the focused light. A spectroradiometer (CL-500A, manufactured by KONICA MINOLTA, INC.) was used to determine the illuminance of the light transmitting through the surface of the sample opposite the surface irradiated with the focused light.

Illuminance (%) was evaluated by a value relative to that (taken as 100) of a YAG:Ce single-crystal body.

<Color Unevenness>

Color unevenness (i.e., variation in color) was evaluated through determination of a variation in chromaticity by means of an illuminometer.

Specifically, each sample was processed into a shape of 13 mm×13 mm×0.2 mm (thickness). Blue LD light (wavelength: 465 nm) was focused to a width of 0.5 mm by means of a lens, and the processed sample was irradiated with the focused light. A spectroradiometer (CL-500A, manufactured by KONICA MINOLTA, INC.) was used to determine the chromaticity of the light transmitting through the surface of the sample opposite the surface irradiated with the focused light.

Figure 5:
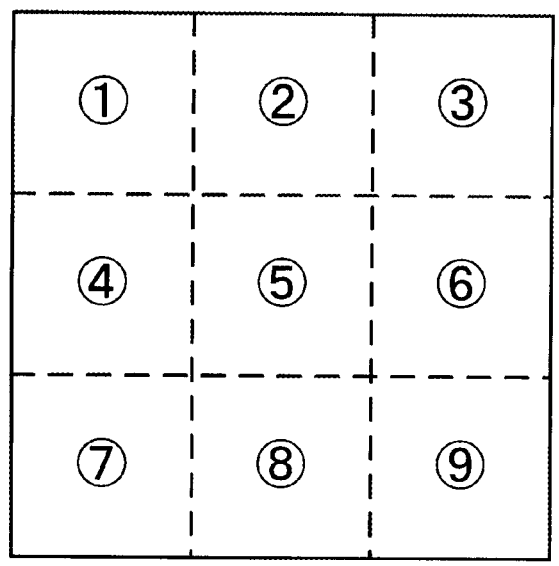
FIG. 5 Explanatory view showing a method of determining color unevenness.

As illustrated in FIG. 5, a 9 mm square center portion of the surface of each sample (i.e., sample surface) was divided into nine regions (at intervals of 3 mm), and the light irradiation was performed on each region. A variation (ΔX) in chromaticity (in X-direction) of the region was evaluated. As used herein, the term "variation (ΔX)" refers to the maximum deviation of chromaticity (in X-direction). A variation ΔX of less than 0.03 is preferred.

The term "chromaticity" as used herein refers to a chromaticity indicated by the CIE-XYZ color system established by the International Commission on Illumination (CIE) in 1931. Specifically, the chromaticity is indicated by the xy chromaticity diagram (so-called CIE chromaticity diagram), wherein three primary colors of light are digitized and represented in an xy coordinate space.

<Fluorescence Intensity>

Each sample was processed into a shape of 13 mm×13 mm×0.2 mm (thickness). Blue LD light (wavelength: 465 nm) was focused to a width of 0.5 mm by means of a lens, and the processed sample was irradiated with the focused light. The light transmitting through the sample was focused by means of a lens, and the emission intensity (i.e., fluorescence intensity) was measured by means of a power sensor. The sample was irradiated with the light at a power density of 40 W/mm².

Fluorescence intensity (%) was evaluated by a value relative to that (taken as 100) of a YAG:Ce single-crystal body.

[2-2. Production Method for Sample and Evaluation Results]

Next will be described a production method for each sample, and the results of evaluation of the sample.

Example 1

Ceramic sintered body samples Nos. 1 to 9 (i.e., optical wavelength conversion members) were prepared under the conditions shown in Table 1.

Specifically, for preparation of each ceramic sintered body sample, $Al_2O_3$ powder (mean particle size: 0.2 μm), $Y_2O_3$ powder (mean particle size: 1.2 μm), $Gd_2O_3$ powder (mean particle size: 1.5 μm), and $CeO_2$ powder (mean particle size: 1.5 μm) were weighed as shown in Table 1.

The $A_3B_5O_{12}$:Ce content was fixed to 30 vol. % relative to the entire ceramic sintered body. The Ce content was fixed to 0.3 mol % relative to the element A.

These powders were added to a ball mill together with ethanol, and these materials were ground and mixed for 4 to 48 hours. The resultant slurry was dried and granulated, and the resultant granular product was press-formed into a compact. The compact was fired in air at 1,500 to 1,800° C. for 2 to 10 hours.

Specifically, in samples Nos. 1 and 2, the grinding was performed for more than 30 hours, and the firing was performed at 1,500° C. for two to five hours.

In samples Nos. 3 to 7, the grinding was performed for 16 hours, and the firing was performed at 1,500° C. to 1,750° C. for 10 hours.

In samples Nos. 8 and 9, the grinding was performed for 16 hours and 4 hours, respectively, and the firing was performed at 1,800° C. for 10 hours.

The samples of Example 1 can be prepared under the aforementioned conditions (different grinding times and firing conditions). For example, the longer the grinding time, the smaller the crystal grain size. When the firing temperature is elevated, crystal grains are grown; i.e., an increase in grain size. Thus, these conditions probably affect the interfacial length.

Subsequently, each ceramic sintered body sample produced in the aforementioned manner was evaluated by the aforementioned evaluation methods. The results are shown in Table 1.

As shown in Table 1, samples Nos. 3 to 7 (area ratio a: 0.3<a<34, interfacial length y of fluorescent phase: 300 μm<y<1,050 μm) exhibited good results; i.e., high fluorescence intensity, high illuminance, and reduced color unevenness.

In contrast, samples Nos. 1 and 2 (interfacial length y: more than 1,050 μm) exhibited low transmittance and low fluorescence intensity and illuminance. Samples Nos. 8 and 9 (interfacial length y: less than 300 μm) exhibited increased color unevenness due to very high transmittance of blue light.

Although not shown in Table 1, all the samples exhibited a relative density of 99% or more. Similarly, the samples of Examples 2 to 4 exhibited a relative density of 99% or more.

Example 2

Ceramic sintered body samples Nos. 10 to 19 were prepared under the conditions shown in Table 1.

In Example 2, samples were prepared basically in the same manner as in Example 1.

However, the grinding was performed for 16 hours, the firing was performed at 1,600° C. for 10 hours, and the $A_3B_5O_{12}$:Ce content was fixed to 1 vol. % to 80 vol. % relative to the entire ceramic sintered body.

Each ceramic sintered body sample produced in the aforementioned manner was evaluated by the aforementioned evaluation methods. The results are shown in Table 1.

As shown in Table 1, samples Nos. 11 to 18 ($A_3B_5O_{12}$:Ce content: 3 vol. % to 70 vol. %) exhibited good results; i.e., high emission intensity and reduced color unevenness.

In contrast, sample No. 10 ($A_3B_5O_{12}$:Ce content: 1 vol. %) exhibited low fluorescence intensity due to insufficient fluorescence. Sample No. 19 ($A_3B_5O_{12}$:Ce content: 80 vol. %) exhibited a considerable increase in temperature due to reduced thermal conduction, and low emission intensity due to temperature quenching.

Example 3

Ceramic sintered body samples Nos. 20 to 26 were prepared under the conditions shown in Table 1.

In Example 3, samples were prepared basically in the same manner as in Example 1.

However, the grinding time and the firing conditions were the same as those in Example 2. The $A_3B_5O_{12}$:Ce content was fixed to 30 vol. % relative to the entire ceramic sintered body, and the Ce content was adjusted to 0.05 mol. % to 2.0 mol. %.

Each ceramic sintered body sample produced in the aforementioned manner was evaluated by the aforementioned evaluation methods. The results are shown in Table 1.

As shown in Table 1, samples Nos. 21 to 25 (Ce content: 0.1 mol. % to 1 mol. %) exhibited good results; i.e., high emission intensity, high illuminance, and reduced color unevenness.

In contrast, sample No. 20 (Ce content: less than 0.1 mol. %) exhibited low fluorescence intensity due to a small amount of emission center ion (i.e., insufficient fluorescence). Sample No. 26 (Ce content: more than 1 mol. %) exhibited low fluorescence intensity due to concentration quenching caused by excess Ce.

Example 4

Ceramic sintered body samples Nos. 27 to 30 were prepared under the conditions shown in Table 1.

In Example 4, samples were prepared basically in the same manner as in Example 1.

However, $Y_2O_3$ powder was used in combination with at least one of $Lu_2O_3$ powder (mean particle size: 1.3 μm), $Yb_2O_3$ powder (mean particle size: 1.5 μm), and $Ga_2O_3$ powder (mean particle size: 1.3 μm). During mixing of the raw materials, the proportions of the raw materials were varied so that specific $A_3B_5O_{12}$:Ce was synthesized. The grinding time and the firing conditions were the same as those in Example 2.

Each ceramic sintered body sample produced in the aforementioned manner was evaluated by the aforementioned evaluation methods. The results are shown in Table 1.

As shown in Table 1, all the ceramic sintered body samples (Nos. 27 to 30) exhibited good results in terms of illuminance, fluorescence intensity, and color unevenness.

TABLE 1

| | No. | A | B | $A_3B_5O_{12}$:Ce content (vol %) | Ce content (mol %) | Open porosity (%) | Area ratio (translucent phase/fluorescent phase) | Translucent phase mean grain size (μm) |
|---|---|---|---|---|---|---|---|---|
| Example 1 | 1 | Y, Gd | Al | 30 | 0.3 | 0.4 | 2.33 | 0.11 |
| | 2 | Y, Gd | Al | 30 | 0.3 | 0.02 | 2.38 | 0.24 |
| | 3 | Y, Gd | Al | 30 | 0.3 | 0.02 | 2.32 | 0.32 |
| | 4 | Y, Gd | Al | 30 | 0.3 | 0.01 | 2.31 | 0.98 |
| | 5 | Y, Gd | Al | 30 | 0.3 | 0 | 2.28 | 1.44 |
| | 6 | Y, Gd | Al | 30 | 0.3 | 0.01 | 2.44 | 1.87 |
| | 7 | Y, Gd | Al | 30 | 0.3 | 0.02 | 2.39 | 3.6 |
| | 8 | Y, Gd | Al | 30 | 0.3 | 0.02 | 2.39 | 6.2 |
| | 9 | Y, Gd | Al | 30 | 0.3 | 0.2 | 2.32 | 9 |
| Example 2 | 10 | Y, Gd | Al | 1 | 0.3 | 0.01 | 81.64 | 1.1 |
| | 11 | Y, Gd | Al | 3 | 0.3 | 0.02 | 32.67 | 1.08 |
| | 12 | Y, Gd | Al | 5 | 0.3 | 0.02 | 17.98 | 1.07 |
| | 13 | Y, Gd | Al | 10 | 0.3 | 0.01 | 8.79 | 1.02 |
| | 14 | Y, Gd | Al | 30 | 0.3 | 0.02 | 2.31 | 0.98 |
| | 15 | Y, Gd | Al | 40 | 0.3 | 0.01 | 1.49 | 0.95 |
| | 16 | Y, Gd | Al | 50 | 0.3 | 0.02 | 1.00 | 0.9 |
| | 17 | Y, Gd | Al | 60 | 0.3 | 0 | 0.66 | 0.88 |
| | 18 | Y, Gd | Al | 70 | 0.3 | 0 | 0.43 | 0.87 |
| | 19 | Y, Gd | Al | 80 | 0.3 | 0.01 | 0.25 | 0.85 |
| Example 3 | 20 | Y, Gd | Al | 30 | 0.05 | 0.01 | 2.32 | 0.6 |
| | 21 | Y, Gd | Al | 30 | 0.1 | 0.01 | 2.37 | 0.92 |
| | 22 | Y, Gd | Al | 30 | 0.3 | 0.01 | 2.31 | 0.98 |
| | 23 | Y, Gd | Al | 30 | 0.5 | 0 | 2.28 | 0.97 |
| | 24 | Y, Gd | Al | 30 | 0.7 | 0.01 | 2.36 | 0.97 |
| | 25 | Y, Gd | Al | 30 | 1 | 0.02 | 2.37 | 0.97 |
| | 26 | Y, Gd | Al | 30 | 2 | 0.02 | 2.35 | 0.97 |
| Example 4 | 27 | Lu | Al | 30 | 0.3 | 0.01 | 2.37 | 1.36 |
| | 28 | Lu | Al, Ga | 30 | 0.3 | 0 | 2.26 | 1.41 |
| | 29 | Yb | Al | 30 | 0.3 | 0.03 | 2.39 | 1.51 |
| | 30 | Yb | Al, Ga | 30 | 0.3 | 0 | 2.27 | 1.46 |

| | No. | $A_3B_5O_{12}$:Ce mean grain size (μm) | Grain size ratio of translucent phase/fluorescent phase | $A_3B_5O_{12}$:Ce interfacial length (μm) | Illuminance (%) | Color unevenness (ΔX) | Fluorescence intensity (%) |
|---|---|---|---|---|---|---|---|
| Example 1 | 1 | 0.1 | 1.1 | 1070 | 78 | 0.0006 | 83 |
| | 2 | 0.22 | 1.09 | 1056.07 | 80 | 0.0007 | 85 |
| | 3 | 0.24 | 1.33 | 823.41 | 101 | 0.0008 | 100 |

TABLE 1-continued

|  | | | | | | | |
|---|---|---|---|---|---|---|---|
|  | 4 | 0.58 | 1.69 | 802.19 | 120 | 0.001 | 110 |
|  | 5 | 0.91 | 1.58 | 749.00 | 125 | 0.0016 | 114 |
|  | 6 | 1.09 | 1.72 | 616.00 | 130 | 0.0019 | 125 |
|  | 7 | 2.2 | 1.64 | 484.00 | 124 | 0.0024 | 120 |
|  | 8 | 2.9 | 2.14 | 294.56 | 95 | 0.0032 | 95 |
|  | 9 | 4.1 | 2.20 | 275.00 | 93 | 0.0045 | 89 |
| Example 2 | 10 | 0.51 | 2.16 | 817.04 | 78 | 0.004 | 80.0 |
|  | 11 | 0.52 | 2.08 | 814.92 | 100 | 0.0026 | 100.0 |
|  | 12 | 0.52 | 2.06 | 814.92 | 113 | 0.0022 | 103.0 |
|  | 13 | 0.55 | 1.85 | 808.56 | 118 | 0.0015 | 105.0 |
|  | 14 | 0.58 | 1.69 | 802.19 | 120 | 0.001 | 110 |
|  | 15 | 0.62 | 1.53 | 793.71 | 110 | 0.00095 | 118.0 |
|  | 16 | 0.67 | 1.34 | 783.10 | 108 | 0.00088 | 120.0 |
|  | 17 | 0.72 | 1.22 | 772.50 | 106 | 0.00085 | 124.0 |
|  | 18 | 0.75 | 1.16 | 766.13 | 103 | 0.00084 | 128.0 |
|  | 19 | 0.78 | 1.09 | 759.77 | 84 | 0.0008 | 130.0 |
| Example 3 | 20 | 0.58 | 1.03 | 812.80 | 80 | 0.0024 | 82 |
|  | 21 | 0.54 | 1.70 | 810.68 | 105 | 0.0012 | 100 |
|  | 22 | 0.58 | 1.69 | 802.19 | 120 | 0.001 | 110 |
|  | 23 | 0.57 | 1.70 | 804.32 | 123 | 0.0011 | 115 |
|  | 24 | 0.56 | 1.73 | 806.44 | 110 | 0.0015 | 105 |
|  | 25 | 0.55 | 1.76 | 808.56 | 104 | 0.0016 | 101 |
|  | 26 | 0.88 | 1.10 | 806.44 | 90 | 0.0014 | 92 |
| Example 4 | 27 | 0.92 | 1.48 | 762.00 | 130 | 0.0015 | 120 |
|  | 28 | 0.94 | 1.50 | 753.00 | 124 | 0.0012 | 115 |
|  | 29 | 1.02 | 1.48 | 744.00 | 120 | 0.0011 | 114 |
|  | 30 | 1.05 | 1.39 | 780.00 | 140 | 0.0012 | 105 |

4. Other Embodiments

Needless to say, the present disclosure is not limited to the aforementioned embodiment, but may be implemented in various other forms without departing from the scope of the present invention.

(1) For example, the aforementioned embodiment employs an air firing process for the preparation of a sample.

However, a hot pressing process, a vacuum firing process, a reducing-atmosphere firing process, an HIP process, or any combination of these processes may be used for the preparation of a sample having the same properties as those described in the embodiment.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) No particular limitation is imposed on the light-emitting element used for the light-emitting device. The light-emitting element may be any well known one, such as LED or LD.

(4) In the aforementioned embodiment, the function of a single component may be shared by a plurality of components, or a single component may exert the functions of a plurality of components. Some of the components in the aforementioned embodiment may be omitted. At least some of the components in the aforementioned embodiment may be, for example, added to or replaced with components in another embodiment.

Embodiments of the present disclosure encompass any form included in technical ideas specified by the appended claims.

DESCRIPTION OF REFERENCE NUMERALS

1: light-emitting device; 5: light-emitting element; and 9: optical wavelength conversion member

The invention claimed is:

1. An optical wavelength conversion member comprising a ceramic sintered body having a fluorescent phase containing fluorescent crystal grains as a main component and a translucent phase containing translucent crystal grains as a main component, wherein
the crystal grains of the fluorescent phase have a composition represented by formula $A_3B_5O_{12}$:Ce, and each of the element A and the element B is at least one element selected from the following element groups:
A: Sc, Y, and lanthanoids (except for Ce), and
B: Al and Ga; and
the following relations are satisfied:
0.3<a<34 and 300 μm<y<1,050 μm,
wherein a represents the ratio of the area of the translucent phase to the area of the fluorescent phase in a cross section of the optical wavelength conversion member, and y represents the interfacial length of the fluorescent phase.

2. An optical wavelength conversion member according to claim 1, wherein the following relation is satisfied: 1.1<x<2.1, wherein x represents the ratio of the mean grain size r1 of crystal grains of the translucent phase to the mean grain size r2 of crystal grains of the fluorescent phase; the crystal grains of the translucent phase have a mean grain size r1 of 0.2 μm to 6 μm; and the crystal grains of the fluorescent phase have a mean grain size r2 of 0.1 μm to 4 μm.

3. An optical wavelength conversion member according to claim 1, wherein the crystal grains of the translucent phase have a composition of $Al_2O_3$.

4. An optical wavelength conversion member according to claim 1, wherein the ceramic sintered body contains a compound represented by formula $A_3B_5O_{12}$:Ce in an amount of 3 vol. % to 70 vol. %.

5. An optical wavelength conversion member according to claim 1, wherein the Ce content of the compound represented by formula $A_3B_5O_{12}$:Ce is 0.1 mol % to 1.0 mol % relative to the element A of the compound.

6. A light-emitting device comprising an optical wavelength conversion member as recited in claim 1.

* * * * *